United States Patent [19]

Karwan

[11] Patent Number: 4,549,940
[45] Date of Patent: Oct. 29, 1985

[54] METHOD FOR SURFACE TREATING COPPER FOIL

[76] Inventor: Steven J. Karwan, RD 1, Princeton, N.J. 08540

[21] Appl. No.: 709,616

[22] Filed: Mar. 8, 1985

Related U.S. Application Data

[63] Continuation-in-part of Ser. No. 602,842, Apr. 23, 1984.

[51] Int. Cl.<sup>4</sup> .......................... C25D 1/04; C25D 5/10; C25D 5/16; C25D 5/18
[52] U.S. Cl. ........................................ 204/13; 204/27; 204/40; 204/140
[58] Field of Search ...................... 204/13, 27, 40, 140

[56] References Cited

U.S. PATENT DOCUMENTS

| | | | |
|---|---|---|---|
| 3,293,109 | 12/1966 | Luce | 204/38 A |
| 3,585,010 | 6/1971 | Luce | 204/55 R |
| 3,799,847 | 3/1974 | Vladimirovna | 204/13 |
| 3,857,681 | 12/1974 | Yates | 204/27 |
| 3,918,926 | 11/1975 | Wolski | 204/44 |
| 4,049,481 | 9/1977 | Morisaki | 204/43 Z |
| 4,468,293 | 8/1984 | Polan et al. | 204/27 |
| 4,515,671 | 5/1985 | Polan et al. | 204/228 |

FOREIGN PATENT DOCUMENTS

| | | | |
|---|---|---|---|
| 0112635 | 11/1983 | European Pat. Off. | 204/27 |
| 2118973 | 4/1982 | United Kingdom | 204/27 |
| 2116213 | 3/1983 | United Kingdom | 204/27 |
| 8202991 | 9/1982 | World Int. Prop. Org. | 204/13 |

*Primary Examiner*—T. M. Tufariello
*Attorney, Agent, or Firm*—David A. Jackson; Daniel H. Bobis

[57] ABSTRACT

A method is and its resulting product are disclosed relating to the surface treatment of copper stock such as copper foil to improve its bondability to nonmetallic substrates. The method comprises immersing the copper in a bath having a composition consisting essentially of an aqueous solution of copper sulfate and sulfuric acid. While immersed in the bath, the copper is subjected to a plurality of pulsing treatment cycles, with each treatment cycle comprising a first application of peak current of a magnitude and duration sufficient to form a first layer coating on the surface of the copper but insufficient to cause the formation of a nodular coating exhibiting treatment transfer; and a second application of base current of a magnitude less than that of the peak current and sufficient to interrupt the formation of the first nodular layer but insufficient to serve to anchor the same to the foil surface. Preferably, the second application of current is longer than the first current application, with each treatment cycle milliseconds in duration, and all treatment cycles may be performed continuously. The resulting copper product is inexpensively prepared and exhibits uniformly superior bond strengths rendering it particularly well suited for printed circuit applications.

13 Claims, No Drawings

METHOD FOR SURFACE TREATING COPPER FOIL

CROSS REFERENCE TO RELATED APPLICATION

The present application is a continuation-in-part of copending application Ser. No. 602,842 filed Apr. 23, 1984 by the inventor herein.

BACKGROUND OF THE INVENTION

1. Field of the Invention

The present invention relates generally to the surface treatment of copper foil, and particularly to such treatments as are designed to render the surface of the copper foil more adherent, such as for printed circuit applications.

2. Description of the Prior Art

The use of copper foil in applications where adhesion to a non-metallic, or resinous substrate is required, is well known. For example, U.S. Pat. No. 4,088,547 to Albertson illustrates an application whereby copper foil of improved bond strength is used for the preparation of solar heat collectors. Most prevalently, however, adherent copper foil is used for the purpose of manufacturing printed circuits, wherein the foil is bonded to an appropriate resinous substrate. Numerous patents dealing with the surface treatment of copper foil to render it more adherent to plastic are known: for example, such pretreatments are disclosed in U.S. Pat. No. 3,220,897 to Conley et al.; U.S. Pat. No. 3,293,109 to Luce et al.; U.S. Pat. No. 3,585,010 to Luce et al.; U.S. Pat. No. 3,799,847 to Vladimirovna et al.; U.S. Pat. No. 3,857,681 to Yates et al.; U.S. Pat. No. 4,049,481 to Morisaki; U.S. Pat. No. Re. 29,820 to Konicek; U.S. Pat. No. Re. 30,180 to Wolski et al.; and WIPO Publication No. 8,202,991 to Torday The foregoing patents are representative of disclosures that identify the difficulties encountered in the prior art, in the bonding of copper to synthetic substrates. In particular, the production of printed electronic circuits involve the bonding of the copper foil to the polymeric substrate, followed by the selective removal of portions of the copper foil to define the actual electronic circuitry. The foil is generally selectively removed by acid etching, whereupon a desired metal pattern is achieved. One of the problems involved in the formation of printed circuits, however, has been a tendency on the part of the copper foil to exhibit inferior bonding capability with the resin substrate, with the result that the final circuit board is commercially unacceptable. Frequent difficulties comprise delamination or even fracture of the copper layer. The prior art relates that numerous efforts to improve bonding have included the application of novel adhesives and efforts to pretreat the bonding surface of the copper foil to render it more adherent.

As pointed out in U.S. Pat. No. Re. 30,180, efforts to improve bond strength of copper have involved the deposition on the surface of the copper foil of a layer of "nodular" copper, to increase surface area and roughness. This deposition has usually required the subsequent application of a layer of pure copper or the like, to "lock" the particulate copper/copper oxide on to the surface of the foil, and to prevent otherwise disadvantageous powder transfer. While these treatments have been tried in their many variations, as set forth in representative form in the above listed patents, none have succeeded in simultaneously optimizing bond strength and economy of preparation. Thus, early efforts to increase bond strength comprised the deposition of additional quantities of nodular copper, however this approach resulted in powder and oxide transfer problems. Efforts to avoid such transfer problems centered around decreasing the thickness of the nodular copper electrodeposit, which consequently caused an undesirable loss in bond strength.

Of the patents listed above, Applicant notes that the most prevalent techniques for the treatment of copper foil are disclosed in the '109 Patent to Luce et al. and the U.S. Pat. No. Re. 30,180 to Wolski et al. In each of these patents, an attempt to improve bond strength of copper is made by the application of a first "roughening treatment", whereby particulate or "dendritic" copper is applied to the surface of the foil, and a second "locking" or "gilding" treatment whereby a smooth layer of copper is electrodeposited over the first roughened surface to secure it to the foil substrate. In the Luce et al. technique, each treatment utilizes a bath of different composition, and the bath wherein the first or roughening treatment is applied, must critically contain a proteinaceous material such as animal hide glue, to control the nature of the deposition of the first nodular layer. In the Reissue Patent to Wolski et al., the first layer is prepared from a bath containing copper and arsenic, the arsenic added to improve bond strength of the deposited layer. The Wolski et al. technique includes a third surface treatment to apply a further electrodeposited microcrystalline copper and arsenic-containing layer.

The techniques described above have been investigated for the purpose of developing a commercially attractive copper foil product, and were found to be undesirably complex and expensive to practice. The requirement of separate treating baths and the constant replenishment of the relatively expensive ingredients presented drawbacks. Also, tank contamination frequently occurred when the foil was transferred between the separate treatment baths, and the added step of rinsing the foil was required to alleviate this problem. The use of the rinse(s) also placed an increased burden on pollution control.

In the earlier work by the present inventor, disclosed in copending application Ser. No. 602,842, the disclosure of which is incorporated herein by reference, the prior art techniques were distinguished by the development of a method wherein copper foil was treated in a single treatment bath consisting essentially of an aqueous solution of copper sulfate and sulfuric acid, wherein the copper foil was subjected to a multitude of treatment cycles wherein electric current is applied while the foil remains immersed in the solution, the first application of current conducted at a magnitude and duration sufficient to deposit a first nodular layer on the surface of the copper foil, with the second application of electric current of a magnitude less than that of the first, to form a second layer of copper thereover. This technique contemplated a multitude of such treatment cycles to develop in the final treated copper foil a coating offering substantially improved bonding characteristics and freedom from undesirable treatment transfer. While this technique is capable of achieving bond strengths on the order of 17 to 18 pounds per inch width for 2-ounce copper foil, it was theorized that even this technique might be further improved to achieve greater bond strengths with reduced input in total treatment time and corresponding expense of equipment and materials. To this end, the previous work and method just described was evaluated to determine those modifications both in theory and in practice, that might make possible the achievement of these improved attributes and results.

The present application is therefore an outgrowth of the additional work by the inventor that has culminated in a further and redefined treatment method.

SUMMARY OF THE INVENTION

In accordance with the present invention a method for treating the surface of copper foil to improve bond strength is disclosed which comprises immersing the copper foil in an aqueous solution consisting essentially of copper sulfate and sulfuric acid, and exposing the immersed copper foil within said solution to a continuous treatment of electric current consisting essentially of the application of electric current by a plurality of pulsing treatment cycles. Each of the treatment cycles consists essentially of a first peak current phase and a second base current phase.

The peak current phase is performed at a current density and for a duration sufficient to deposit a fully adherent nodular layer on the surface of the copper foil, but that is insufficient to cause the formation of such nodular deposit as results in treatment transfer and requires a further coating to anchor said nodular layer to the foil surface. The nodular layer consists essentially of copper. The base current phase is performed at a current density of a magnitude less than that of the peak current phase, sufficient to dispose over the nodular deposit just formed a thin and tightly adherent layer of smooth copper to interrupt the formation of said nodular deposit occurring during the previous peak current phase, but insufficient to anchor the nodular deposit to the foil surface.

In one embodiment of the present invention, the second application of current may be of shorter duration than the first application of current, while in an alternate embodiment, the duration of the second or base current application may exceed that of the first or peak current application. In a further embodiment, each succeeding treatment cycle may be conducted for a shorter duration than the cycle performed previously, and preferably each of the respective applications of electric current may likewise be shorter in duration.

In a particular embodiment of the invention, the copper may have applied to it as many as 2,500 treatment cycles, to build up a corresponding number of layers of successive nodular deposits. Moreover, the time of each individual cycle may vary depending upon the sophistication of the treatment control equipment used, and individual applications of durations ranging from about 4 to about 100 milliseconds (ms) or more are contemplated herein. The current densities useful in each cycle could vary broadly up to a maximum on the order of 300 ASF (amps per square foot) or higher, with the current for the peak current phase capable of ranging from about 56 to about 80 ASF, and the current density of the base current phase capable of ranging for example, from about 36 to about 60 ASF. The foregoing ranges are exemplary and are based on the absence of active agitation of the treatment bath, and the maintenance of the bath at approximate room temperature.

One of the features of the present invention is the employment of a single treating bath consisting essentially of an aqueous solution of copper sulfate ($CuSO_4.5H_2O$) and sulfuric acid. In particular, the concentrations within the treatment bath may remain the same for both current applications, with copper, for example, present as the metal, in an amount of 39 grams per liter, and sulfuric acid present in an amount of 63 grams per liter. The foregoing amounts are exemplary, and certain variation is contemplated, it being borne in mind, however, that the exact concentration of each component remains relatively constant throughout any given practice of the present method.

The present invention also relates to copper foil having the complex surface structure attributable to the practice of the present method, defined as a plurality of electrodeposited layers, each layer consisting essentially of a nodular coating prepared essentially from copper, with its upper surface bearing a further layer also prepared essentially from copper, which serves primarily to interrupt the formation of the nodular layer as so to prevent the development of the loose, granular surface that results in treatment transfer. Thus, each nodular layer is self-adherent and does not require special treatment such as "gilding" to secure it to the foil surface, and each smooth copper layer is sufficient to serve as a barrier to further nodularization, but insufficient to serve as an anchoring means for the nodular layer, if such were needed.

The present method results in products having no treatment transfer and whose treated surface is comprised of a complex pattern of irregularities that is eminently suited for the formation of improved bonds when laminated to the resinous bases used in the manufacture of printed circuit boards. The copper foil treated in accordance with the present invention possesses substantially superior bond strengths, with peel strengths up to 25 pounds per inch width or greater for 2-ounce foil being uniformly and regularly achievable. The employment of the single bath and the continuous rapid alternation or "pulsing" application of electric current, affords a relatively expedient and inexpensive means for the application of electrodeposited copper coatings which may be practiced with minimum usage of complex and expensive equipment.

Accordingly, it is a principal object of the present invention to provide a method for the treatment of copper foil to provide improved surface bond strength.

It is a further object of the present invention to provide a method as aforesaid that is inexpensive and more easily controlled.

It is a yet further object of the present invention to provide a method as aforesaid that results in the preparation of uniformly superior surface bond strengths.

It is a still further object of the present invention to provide a copper foil prepared in accordance with the method as aforesaid that offers improved quality at reduced cost.

Other objects and advantages will become apparent to those skilled in the art from a review of the ensuing detailed description.

DETAILED DESCRIPTION

In accordance with the present invention, the surface of copper foil is rendered improved in its bondability by the exposure to a treatment method comprising immersing the copper foil in a bath consisting essentially of an aqueous solution of copper sulfate and sulfuric acid, and applying to the foil a continuous treatment of electric current consisting essentially of a plurality of pulsing treatment cycles to cause the deposition on the surface of the foil of an adherent, irregular surface of improved bonding capability.

Each of the pulsing treatment cycles consists essentially of a first peak current phase consisting essentially of the application of current of a magnitude and duration sufficient to form a fully adherent nodular layer on the surface of the copper but that is insufficient to cause the formation of weak nodular deposits that result in treatment transfer and require a further external means such as an additional "gilding" coating to anchor the nodular layer to the foil surface. A second base current phase follows which consists essentially of the application of current of a magnitude less than that of the peak current phase, sufficient to dispose over the nodular deposit just formed, a thin tightly adherent layer of smooth copper to interrupt the formation of the nodular deposit just applied, but insufficient to anchor the nodular deposit to the foil surface.

The general treatment cycle wherein a first "nodular" layer is disposed on the copper surface and a second "gilding" layer is thereafter applied, is generally disclosed in the prior art. The present invention distinguishes the prior art in a first aspect, by the use of a single treating bath consisting essentially of an aqueous solution of copper sulfate and sulfuric acid, and the corresponding formation of all layers therein, which layers consist essentially of copper, and in a second important aspect, by the absence of a layer that serves as a "gilding" layer.

The treatment bath is characterized by the absence of additional ingredients such as other metallic salts, halide salts and protein materials, such as are disclosed in the prior art. This is significant in view of the substantial improvement in bond strengths obtainable by the present invention, particuarly in light of prior art teachings that additives such as arsenic and animal hide glue are necessary to achieve an improved product with reduced treatment transfer.

The composition of the bath is likewise distinct in that it is maintained at a particular proportional level throughout the practice of the present method. For example, the bath may optimally contain copper expressed as the metal, in an amount for example, of about 39 grams per liter, and sulfuric acid in an amount of about 63 grams per liter. The present bath is capable of providing the necessary environment for the formation of the improved nodular layer of the present method without the need for the adjustment of the ingredients or their amounts. This ability to operate within a single relatively constant bath composition is one of the distinct features of the present method.

While the present method relates to the surface treatment of copper foil, it is to be understood that copper wire, rods, bars and the like may be similarly treated, and that the present invention encompasses all of these variant copper products within its scope. Thus, copper foil whether electroformed, rolled or otherwise prepared may be treated in accordance herewith, and variant gages of such foil such as 1-ounce or 2-ounce foil may be treated equivalently.

The continuous electrical treatment consisting essentially of the electrical pulsing cycles of the present method are distinctive and find no parallel in the prior art, in that the variation in the structure of the layers deposited is achieved by adjustment of magnitude and duration of electrical current applied. The first peak current phase is conducted at a current density and for a duration sufficient to form a nodular or dendritic copper electrodeposited coating but insufficient to form such coating as would exhibit treatment transfer. The dendritic coating is disclosed in the prior art discussed earlier herein, and it is noted, offers the increase in surface area and roughness that is necessary to improve bondability of the copper foil to the printed circuit substrate. Generally, the nodular or dendritic coating formed by the first application of electric current consists essentially of copper.

As noted in the prior art, there has been a tendency of the initial electrodeposit to be of structural unsoundness, whereby coating or treatment transfer can take place. This transfer is unwanted, as it represents a fracture or disengagement of the metal particles from the coated copper surface. To reduce or eliminate unwanted transfer, the traditional approach has been to make a second application of electric current in either a treatment bath of differing composition, or under differing temperature or electrical conditions, for the express purpose of forming a second "gilding" or "plating" overlayer, to anchor the nodular layer below to the copper foil surface. Even the present inventor initially believed that the process of this invention, particularly as disclosed in earlier filed application No. 602,842 operated on this same principle and that the second application of current disclosed therein served to anchor the first nodular coating. Further work in accordance with the invention has revealed that this prescription is incorrect.

Thus, the present invention in all of its embodiments is predicated upon the continuous deposition of a layered metallic coating, each of the layers of which consists essentially of a lowermost layer that is nodular in structure and an uppermost, thin adherent and smooth copper-containing layer. The nodular layer is applied in such a manner as to be independently secured to the surface below without the need for a "locking" or "gilding" overplate, and correspondingly, the second smooth copper-containing layer is present as a barrier between adjacent nodular layers and is accordingly insufficient to serve as a "gilding" layer for the nodular layer beneath it. In the present invention, the continuous two phase electrical treatment that forms each of the nodular layers is comprised of a first treatment at a peak current density, followed by a second treatment at a lower base current density. The repetition of this alternation in current density is defined as "pulsing" in accordance with the present invention, so that each treatment cycle or "pulse" can be said to form a particular enhanced nodular layer.

The present invention is a significant departure from the prior art in that it is based on the continuous cyclical variation in current density and duration of electrical treatment that creates the plurality of discrete self-adhering nodular layers and intermediate smooth, copper-containing layers that exhibit neither the treatment transfer nor any of the structural defects noted in the prior art.

The structural characteristics of the nodular layer of the present invention are substantially different from that of the plated nodular layers of the prior art, for, as noted, the second or base current density application serves primarily to interrupt the formation of the previous nodular layer and thus only forms a thin, tightly adherent layer of smooth copper that serves primarily as a barrier between successively formed nodular deposits, and not as a "locking" or "gilding" layer as is taught and employed in the prior art. It is therefore significant that the duration and current density of the base current phase are such as to be insufficient at all points within the practice of the present method, to form a "gilding" layer or to otherwise affect the just formed nodular layer to anchor it to the foil substrate. Thus, it can accordingly be visualized that the present method forms a striated essentially nodular electrodeposit with individual nodular layers separated and thus defined but not bonded, by the interposition of the intermediate smooth copper layers resulting from the rapid variation in current density.

Accordingly, a series of successive treatment cycles are performed, each cycle comprising a first peak current application and second base current application of electric current. The current densities of each of the current applications in each cycle may range to a maximum on the order of 300 amps per square foot or more and the duration thereof may be up to about 100 milliseconds. The extremely short duration of the present treatment cycles is another important distinction between the present invention and the prior art, as the shortest treatment times disclosed by Luce et al. '109 is 5 seconds, which is a different order of magnitude from the present time parameters. The fact that the present method successfully forms deposits of improved strength and bondability is surprising in view of the prior art teachings that minimum treatment times far greater than are used herein are necessary. Also, the parameters of the application of the base current density phase are such as to be insufficient to allow the formation of a layer that is capable of anchoring the nodular underlayer to the foil surface, and this is naturally reflected in the shortness of duration of the base current phase.

In accordance with a preferred embodiment, the successive treatment cycles are performed continuously. Also, the respective current densities of each of the first and second electric current applications in a series of treatment cycles can remain the same, while the duration of the second application of each cycle may vary and may be longer than that of the first application.

In similar fashion and in accordance with a further aspect of the invention, the duration of each cycle may be increased from that of the cycle preceding it. For example, one may apply a first nodular layer by exposing the copper surface within the treatment bath to a current density of about 80 amps per square foot for a time of approximately 10 milliseconds. Thereafter, the second current application may be conducted at a current density for example, of about 50 amps per square foot for a period of about 60 milliseconds. A second treatment cycle may repeat the current density of the peak current application but may extend longer in duration by, for example, a lengthening of the duration of the base current density application to 80 milliseconds.

Still further, the initial treatment times may be of a minimal duration with a base current density time of, say, 4 milliseconds, which is increased gradually during consecutive "pulses" to a treatment time of 70 milliseconds. The foregoing treatment schedules are exemplary only and are submitted herewith in fulfillment of Applicant's duty to disclose operative exemplary modes of the practice of the present invention.

As expressed earlier, the present invention contemplates a large number of treatment cycles and therefore as many as 2,500 such cycles may be performed, such cycles of such relatively brief duration, however, that the entire treatment process contemplating this large number of cycles may be completed in from 3 to 3.5 minutes. Throughout the entire process however, the treatment bath is maintained relatively constant as to its quantitative and qualitative composition, with the only variables being the current densities and the duration of treatment times. It should be noted that the prior art methods, by contrast with the present invention, would require as many as 120 to 140 separate treatment tanks or more, and the necessary equal number of rinsing stations, as well as corresponding numbers of control equipment to continuously apply as many consecutive layers of the their compositions, as can be be accomplished herein with a single tank and its related control equipment.

The present method may be performed within a relatively broad range of temperatures and such range may include room temperature operation. Thus, for example, the temperature may range from about 60° F. to about 80° F. without limitation, the foregoing range being illustrative only. It should be noted that the present method is somewhat temperature-dependent, in that lower temperatures favor the deposition of a nodular layer. As long as the temperature is maintained at a relatively constant level i.e. plus or minus two degrees of a particular chosen operating temperature and preferably within the aforenoted range, however, it will have no effect on the practice of the present invention.

The copper foil prepared in accordance with the present invention is particularly suited for use in the preparation of printed circuit laminates. Thus, a variety of well known substrates may be laminated or otherwise bonded to the copper foil surface, and particular materials which are known and would be suitable comprise for example, epoxy resin-impregnated fiberglass supports, phenolic resin-impregnated paper, polyester-impregnated glass mat and other products known for use in conjunction with the preparation of flexible and non-flexible substrates.

In such instance, a variety of adhesives are known which may be used to bond the treated copper foil to the substrate, and such adhesives as phenolic-nitrile, phenolic-butyral and acrylic adhesives, fluorinated olefin copolymer adhesives, epoxy resins and the like, all known in the art, are contemplated. As these materials are well known to those skilled in the art, further elaboration thereon is deemed unnecessary herein.

The exact apparatus with which the treatment of the present invention may be carried out is not critical, and one may accordingly use commercially available equipment employed for pulse plating. Accordingly one may use either an insoluble lead anode or an anode of copper foil. Also, to the extent that control over processing parameters such as current density, duration of current application and temperature control are concerned, known control equipment may be used, including such equipment as is programmable and operable by use of microprocessors and the like.

For example, current may be supplied by a conventional pulsing rectifier which is modified to permit a base "on time" of 100 milliseconds, and is coupled with a low ripple, D.C. power source. Naturally, the foregoing explanation is illustrative only, as it is contemplated that the present method may be performed in a totally automated fashion with other perhaps specially designed equipment, and at speeds whereby multiple treatment cycles may be performed within minutes. Thus, one may apply as many as 2,500 layers or more resulting from the performance of full treatment cycles, within a matter of 2 to 4 minutes.

The method of the invention may be practiced either as a batch process or on a continuous basis as the latter is understood in its general commercial sense. Accordingly, batch processing contemplates the immersion of a quantity of foil of finite length in a treatment bath and the maintenance of the foil in the stationary state during treatment, after which the foil is removed from the bath. Continuous processing contemplates the passage of an indefinite length of foil through the bath so that given segments of the foil are moving at a predetermined rate of speed while being treated. It should be emphasized that the term "continuous" as used in the present discussion differs in meaning from the intended meaning of the term as it is used to describe the continuous performance of the treatment cycles and current phases described herein in accordance with the present invention, as in the latter mentioned situation, the term refers to the continuous application of electric current that is a feature of the present method and which is conducted regardless of whether batch or continuous processing is employed. Accordingly, both batch and continuous processing are seen to be included within the scope of the present invention.

The present invention also relates to copper foil and other copper products having disposed thereon an electrodeposit consisting essentially of a plurality of layers, each layer consisting essentially of a lower, self-adherent nodular layer consisting essentially of copper, and an upper, thin and tightly adherent, smooth copper-containing layer that serves as an intermediate layer and is sufficient to interrupt the continuous deposit of the nodular layer, but is insufficient to anchor the nodular layer to the surface of the copper product. Thus each of the nodular layers formed by the present invention are independently bound to the surface of the copper foil or other copper product, and to each other, without external anchoring means, such as a "locking" or "gilding" layer as is used in the prior art. It can therefore be visualized in cross-section that the composite coating may comprise a series of such layers one upon the other in alternating fashion to offer a broad multifaceted, structurally sound surface area for improved bondability to non-metallic substrates.

The bond strengths of copper prepared in accordance with the present invention were tested by the following procedure:

The treated foil was laminated to several plies of Synthane-Taylor Tayloron EF-527 TM epoxy-impregnated glass cloth. This lamination was performed in an electrically heated 10 inch by 12 inch platen press at 350° F., and at a pressure of 500 PSI for 45 minutes. The test of bond strength was performed by peeling a one inch width of the foil at a 90° angle to the laminate, at a speed of two inches per minute.

The present invention and its advantages will be better appreciated from a review of the following illustrative example.

EXAMPLE I

A quantity of 2-ounce copper foil was treated in accordance with the present invention by immersion in an aqueous treatment bath containing copper sulfate expressed as $CuSO_4.5H_2O$, and sulfuric acid. The concentration of copper in the bath was approximately 39 grams per liter while the concentration of sulfuric acid therein was 63 grams per liter. The copper was then subjected to two treatment cycles as set forth in Table I, below:

TABLE I

|  | TIME (SEC) | CURRENT DENSITY (ASF) |
| --- | --- | --- |
| Peak Current | 35 | 80 |
| Base Current | 10 | 70 |
| Peak Current | 16 | 80 |
| Base Current | 5 | 70 |

From the above Table, it can be seen that within approximately one minute, two cycles were performed, so that two layers of an enhanced nodular copper coating were applied to the surface of the foil. The bond strength of this material was tested by the procedure described earlier herein, and was found to be 17.5 pounds per inch width for 2-ounce foil. This compares quite favorably with the techniques of the prior art, wherein a bond strength equivalent to the one just obtained would require a treatment of at least 5 minutes and 15 seconds. Thus, an equivalent product was achieved with a reduction of approximately 79% in treatment time.

The above example, drawn from prior filed Ser. No. 602,842, the disclosure of which is incorporated herein by reference, is illustrative of the first aspect of the present invention, wherein multiple treatment cycles or "pulse" cycles were conducted within a single treatment tank of constant composition, with variations in current density and treatment time made to form a roughened surface coating of acceptable bond strength. Further work performed in accordance with the present invention resulted in the developement of variations in the above technique that achieved improvements in bond strength and increases in the number of deposited layers applied to the foil surface, within a surprisingly reduced period of time. The following example is illustrative.

EXAMPLE II

A strip of untreated 2-ounce copper foil having an bond strength of 5.0 pounds is immersed in a treatment tank comprising an aqueous solution of copper sulfate and sulfuric acid corresponding in composition and concentration to that Example I, above. A pulse rectifier, manufactured by Rapid Electric Company, rated at 50 amperes average peak current output at 15 volts D.C. was modified to extend the "on time" of its base current from a range of 4 to 32 milliseconds, to 100 milliseconds. The rectifier was coupled with a battery an approximate voltage of 6.3 volts.

Treatment was commenced by the imposition of a series of treatment or "pulse" cycles comprising a first application having a peak current density of 78 A.S.F., maintained for a period of approximately 10 milliseconds, followed by the application of a base current having a current density of about 49 A.S.F., maintained for a period of 60 milliseconds. The "base adjust" setting was zero, while the "voltage" and "current adjust" were 100%. The total treatment time was three minutes, during which the bath was maintained without agitation and at a temperature ranging from about 73° to 76° F.

During this time more than 2,500 pulse cycles were employed, each cycle extending for a total of 70 milliseconds. The peel strength of the resulting coated copper foil product was tested in accordance with procedures described hereinabove, and was found to be approximately 25 pounds per inch width of foil.

EXAMPLE III

Additional samples were prepared and tested in the same manner as set forth in Example II, above. The treatment tank composition was maintained approximately the same as were the peak and base current densities. Those parameters that varied from test to test are set forth together with peel strength results, in Table III, below:

TABLE III

| Temp. (°F.) | Total Time (min) | Peak Current Time (ms.) | Base Current Time (ms.) | Peel Strength (lbs/in) |
| --- | --- | --- | --- | --- |
| 72 | 3 | 10 | 60 | 21 |
| 71–73 | 3 | 10 | 60 | 21 |
| 70–72 | 3 | 10 | 60 | 22 |
| 68–70 | 3 | 10 | 60 | 24 |
| 70–73 | 3 | 10 | 60 | 22.5 |
| 71–74 | 3.5 | 10 | 60 | 20.5 |
| 71–74 | 3.5 | 9 | 55 | 22 |
| 70–73 | 3.5 | 8 | 55 | 20 |

From the above Table and Examples, it should be apparent that the parameters of current density and duration, or "on time" may be varied to achieve differing results in the coatings and bond strengths obtainable by the practice of the present method. Thus, and in accordance with a first embodiment of the invention, the base current density "on time" may be varied downwardly as illustrated by Example 1.

Naturally, it is contemplated within the present invention that the base "on time" may also be varied upwardly and for example, may exceed 60 milliseconds in duration. In this fashion, the improved bond strengths attainable in accordance with the present method may be reached within shorter treatment times than those set forth by way of illustration above. The foregoing examples illustrate that adjustments to the duration of the respective treatments can themselves, influence the properties of the resulting composite coating.

As mentioned earlier, it is contemplated that adjustments to treatment times, current densities and temperatures are possible within the aforenoted ranges, to vary the properties of the resulting coating to suit specific product end uses.

It should be clear from the above, that the composite multilayered electrodeposits prepared in accordance with the present invention are not structurally analogous to the treatments applied by the prior art. Clearly, the present invention does not engage in the formation of a series of alternating nodular and "gilding" layers, as to do this would be to limit the potential bond strengths achieved herein. It is only by the imposition of what is essentially a continuous though pulsating nodularizing treatment that the formation of the present composite nodular electrodeposit with its intricately textured surface is possible.

As an alternate to the performance of the present method with a gradual or continuous variation in the duration of the individual current treatment times, it is contemplated that, for example, the base current treatment time may be varied in stepwise fashion, so that, for example, a first series of "pulses" or cycles could be applied wherein the base "on time" would be set for a duration of one-third of the maximum "on time" chosen for that particular treatment sequence. In a second series of "pulses", the base "on time" could be set for two-thirds the maximum, and for the third and final treatment phase, the base "on time" could be maintained at its maximum.

A further alternative contemplating the variations of both current density and duration, visualizes the variation of both the peak current density and base density "on time" from their minima to their maxima on a continuous and simultaneous basis. Thus, the first pulse cycle might be conducted at a minimum peak current density sufficient to form an acceptable nodular layer while at the same time, the base "on time" could be maintained its acceptable minimum. Both parameters could then be varied upwardly on a simultaneous basis in successive "pulse" cycles to their eventual maxima in the final cycles of the treatment. The foregoing is presented for purposes of complete disclosure the scope of variation of the practice of the present invention contemplated by the inventor.

This invention may be embodied in other forms or carried out in other ways without departing from the spirit or essential characteristics thereof. The present disclosure is therefore to be considered as in all respects illustrative and not restrictive, the scope of the invention being indicated by the appended claims, and all changes which come within the meaning and range of equivalency are intended to be embraced therein. Thus, for example, the present method may be employed to treat the foils of metals other than copper, such as nickel foil and others that are favorably receptive to the application of such surface treatments. In such latter instance, although the metal to be treated would be exposed to a bath including a solution of a soluble salt of the same metal in admixture with a suitable acid, the remainder of the parameters of the process would stay the same.

What is claimed is:

1. A method for treating the surface of copper foil to improve the bond strength thereof, consisting essentially of:

A. immersing said copper foil in a bath consisting essentially of an aqueous solution of copper sulfate and sulfuric acid;

B. applying to the bath with said copper foil immersed therein, a continuous treatment of electric current, said treatment consisting essentially of a plurality of pulsing treatment cycles to cause the deposition on the surface of said copper foil of an adherent, irregular surface of improved bonding capability, each of said pulsing treatment cycles consisting essentially of a first peak current phase and a second base current phase;

(i) said peak current phase performed at a current density and for a duration sufficient to form on at least one surface of said foil a fully adherent nodular layer on said surface, said nodular layer consisting essentially of copper, such current density and duration insufficient however, to form a nodular layer that exhibits treatment transfer and requires further treatment to anchor said nodular layer to the surface of said foil;

(ii) said base current phase performed at a current density of a magnitude less than those of said peak current phase, and at a current density and for a duration sufficient to dispose over said nodular layer a thin, tightly adherent layer of smooth copper to interrupt the formation of said nodular layer, but insufficient to anchor said nodular layer to said foil surface; and (iii) wherein said pulsing treatment cycles are each as short as milliseconds in total duration.

2. The method of claim 1 wherein said base current phase is longer in duration than said peak current phase.

3. The method of claim 1 wherein each succeeding base current phase is conducted for a longer duration than the previous.

4. The method of claim 1 wherein each of the respective of said peak and said base current phases is performed at the same magnitude of current.

5. The method of claim 4 wherein the magnitude of said peak current phase varies in current density, from about 56 amps per square foot to about 80 amps per square foot, and said base current phase varies in current density from about 40 amps per square foot to about 70 amps per square foot.

6. The method of claim 1 wherein said bath consists essentially of an aqueous solution of $CuSO_4.5H_2O$ and $H_2SO_4$.

7. The method of claim 6 wherein said bath contains copper in an amount measured as the metal of about 39 grams per liter, and sulfuric acid in an amount of about 63 grams per liter.

8. The method of claim 1 wherein the total time for the performance of each of said treatment cycles is up to about 100 milliseconds.

9. The method of claim 1 wherein the duration of said peak current phase ranges from about 8 to about 10 milliseconds, and the duration of said base current phase ranges from about 10 to about 60 milliseconds.

10. The method of claim 1 wherein said pulsing treatment cycles have a total duration of from about 3 to about 3.5 minutes.

11. The method of claim 1 wherein at least two pulsing treatment cycles are performed.

12. The method of claim 1 wherein at least 60 pulsing treatment cycles are performed.

13. A copper product selected from copper foil, copper rod, copper wire and copper bar stock having a tightly adherent surface electrodeposit offering improved bondability to nonmetallic substrates, said electrodeposit prepared in accordance with the method of claim 1.

* * * * *